(12) United States Patent
Shigehara et al.

(10) Patent No.: US 10,784,671 B2
(45) Date of Patent: Sep. 22, 2020

(54) POWER SUPPLY CONTROL DEVICE

(71) Applicant: Denso Corporation, Kariya-shi, Aichi-ken (JP)

(72) Inventors: Eiichirou Shigehara, Nagoya (JP); Takeshi Hirano, Okazaki (JP); Akira Tokumasu, Kariya (JP)

(73) Assignee: Denso Corporation, Kariya, Aichi-pref. (JP)

( * ) Notice: Subject to any disclaimer, the term of this patent is extended or adjusted under 35 U.S.C. 154(b) by 0 days.

(21) Appl. No.: 16/255,325

(22) Filed: Jan. 23, 2019

(65) Prior Publication Data

US 2019/0229516 A1    Jul. 25, 2019

(30) Foreign Application Priority Data

Jan. 24, 2018    (JP) .................................. 2018-010008

(51) Int. Cl.

| | |
|---|---|
| *H02M 1/32* | (2007.01) |
| *H02H 1/00* | (2006.01) |
| *G01R 19/165* | (2006.01) |
| *H02M 3/335* | (2006.01) |
| *H02H 7/12* | (2006.01) |

(52) U.S. Cl.
CPC ..... *H02H 1/0007* (2013.01); *G01R 19/16528* (2013.01); *H02H 7/1213* (2013.01); *H02M 1/32* (2013.01); *H02M 3/33507* (2013.01); *H02M 3/33515* (2013.01); *G01R 19/1659* (2013.01); *G01R 19/16538* (2013.01)

(58) Field of Classification Search
CPC ...... H02M 1/32; H02M 7/1213; G01R 15/04; G01R 19/1659; G01R 19/16595; H02H 7/1213; H02H 3/207
See application file for complete search history.

(56) References Cited

U.S. PATENT DOCUMENTS

| | | | | |
|---|---|---|---|---|
| 5,264,780 A | * | 11/1993 | Bruer ................. | H02M 1/4225 323/222 |
| 6,356,466 B1 | * | 3/2002 | Smidt ................. | H02M 3/156 323/222 |

(Continued)

FOREIGN PATENT DOCUMENTS

| | | |
|---|---|---|
| JP | 3702142 B2 | 10/2005 |
| JP | 2007-236127 A | 9/2007 |
| JP | 2012-175868 A | 9/2012 |

*Primary Examiner* — Harry R Behm
(74) *Attorney, Agent, or Firm* — Dinsmore & Shohl LLP

(57) ABSTRACT

A power supply control device includes a first overvoltage detection circuit including a first determination element and a second determination element. The first overvoltage detection circuit is configured to detect an overvoltage state of an output voltage using an AND value of an output of the first determination element and an output of the second determination element. The first determination element is configured to determine that a feedback voltage detected by the first detection element is below a first reference voltage, and the second determination element is configured to determine that an overvoltage detection voltage detected by a second detection element exceeds a second reference voltage. The second detection element is connected in parallel to the first detection element and is configured to detect the output voltage as the overvoltage detection voltage.

4 Claims, 2 Drawing Sheets

(56) References Cited

U.S. PATENT DOCUMENTS

| | | | |
|---|---|---|---|
| 8,692,477 B1* | 4/2014 | Lee | H05B 33/0815 |
| | | | 315/185 S |
| 2001/0020803 A1 | 9/2001 | Maru et al. | |
| 2003/0030955 A1* | 2/2003 | Yamamura | H02H 3/006 |
| | | | 361/91.1 |
| 2012/0212205 A1 | 8/2012 | Yamada | |
| 2013/0015833 A1* | 1/2013 | George | H02M 1/32 |
| | | | 323/311 |
| 2013/0335862 A1* | 12/2013 | Xie | H02H 3/06 |
| | | | 361/18 |
| 2014/0035596 A1* | 2/2014 | Lee | G01R 31/00 |
| | | | 324/523 |
| 2016/0254753 A1* | 9/2016 | Malinin | H02M 3/33507 |
| | | | 363/21.16 |
| 2017/0126126 A1* | 5/2017 | Joos | H02M 3/158 |
| 2018/0367027 A1* | 12/2018 | Chen | H02M 1/32 |

* cited by examiner

FIG. 2

| | ABNORMALITY MODE | | | | OUTPUT SIGNAL | | | | POWER SUPPLY OUTPUT |
|---|---|---|---|---|---|---|---|---|---|
| | R1 | R2 | R3 | R4 | OVP_FB | UVP_FB | OVP_MON | OVP | |
| 0 | NORMAL | NORMAL | NORMAL | NORMAL | L | L | L | L | NORMAL OPERATION |
| 1 | OPEN | NORMAL | NORMAL | NORMAL | L | H | H | L | STOP |
| 2 | SHORT | NORMAL | NORMAL | NORMAL | H (STOP) | L | L | L | STOP |
| 3 | NORMAL | OPEN | NORMAL | NORMAL | H (STOP) | L | L | L | STOP |
| 4 | NORMAL | SHORT | NORMAL | NORMAL | L | H | H | L | STOP |
| 5 | NORMAL | NORMAL | OPEN | NORMAL | L | L | L | L | NORMAL OPERATION |
| 6 | NORMAL | NORMAL | SHORT | NORMAL | L | L | H | L | NORMAL OPERATION |
| 7 | NORMAL | NORMAL | NORMAL | OPEN | L | L | H | L | NORMAL OPERATION |
| 8 | NORMAL | NORMAL | NORMAL | SHORT | L | L | L | L | NORMAL OPERATION |

POWER SUPPLY CONTROL DEVICE

CROSS-REFERENCE TO RELATED APPLICATION

This application claims priority to Japanese Patent Application No. 2018-010008 filed on Jan. 24, 2018, incorporated herein by reference in its entirety.

BACKGROUND

1. Technical Field

The present disclosure relates to a power supply control device that detects an output voltage to a load as a feedback voltage and performs feedback control such that the feedback voltage approaches a target value.

2. Description of Related Art

There has been proposed a power supply control device including an error amplifier that outputs an error voltage obtained by amplifying a difference between a fed back feedback voltage obtained by dividing an output voltage Vout of a DC/DC converter unit with voltage dividing resistors and a reference voltage, and a pulse width modulation signal generation circuit that generates a pulse drive signal based on the error voltage and outputs the pulse drive signal to a switching element of the DC/DC converter unit such that the output voltage Vout is maintained at the target value, (for example, see Japanese Unexamined Patent Application Publication No. 2012-175868 (JP 2012-175868 A)). The pulse width modulation signal generation circuit includes a pulse width modulation signal forming circuit that outputs a pulse width modulation basic signal proportional to the error voltage, an overvoltage comparator that compares the feedback voltage with an overvoltage threshold value and outputs a skip signal based on the comparison result, an AND circuit that inputs the pulse width modulation basic signal and a signal obtained by logically inverting the skip signal with an inverter, and an extension circuit that generates and outputs the pulse drive signal based on the output of the AND circuit. The overvoltage comparator outputs a low level skip signal in a case where the feedback voltage is less than the overvoltage threshold value and outputs a high level skip signal in a case where the feedback voltage exceeds the overvoltage threshold value. In a case where the output voltage Vout is in an overvoltage state and the feedback voltage exceeds the overvoltage threshold value, the high level skip signal output from the overvoltage comparator is changed into the low level skip signal by the inverter and is input to the AND circuit. Through the above, the pulse drive signal is turned off, the switching element of the DC/DC converter unit is turned off, and thus the output voltage Vout of an output terminal can be lowered.

SUMMARY

However, in such a power supply control device, in a case where the voltage dividing resistor connected to the output terminal of the DC/DC converter unit fails, the output terminal may output abnormal voltage. For example, in a case where open-circuit fault occurs in an output terminal side voltage dividing resistor or short-circuit fault occurs in a ground side voltage dividing resistor, the feedback voltage input to the error amplifier decreases, and the pulse width modulation signal generation circuit generates the pulse drive signal so that the output voltage increases. As a result, the output voltage is placed in the overvoltage state. Although it may be considered to simply make the voltage dividing resistor redundant, the failure rate also doubles in such a case.

The present disclosure provides a power supply control device that performs feedback control such that an output voltage approaches a target voltage and suitably detects an overvoltage state of the output voltage without increasing a failure rate.

An aspect of the present disclosure relates to a power supply control device that detects an output voltage to a load as a feedback voltage using a first detection element and performs feedback control such that the feedback voltage detected by the first detection element approaches a target value. The power supply control device includes a first overvoltage detection circuit including a first determination element and a second determination element. The first overvoltage detection circuit is configured to detect an overvoltage state of the output voltage using an AND value of an output of the first determination element and an output of the second determination element. The first determination element is configured to determine that the feedback voltage detected by the first detection element is below a first reference voltage, and the second determination element is configured to determine that an overvoltage detection voltage detected by a second detection element exceeds a second reference voltage. The second detection element is connected in parallel to the first detection element and is configured to detect the output voltage as the overvoltage detection voltage.

The power supply control device according to the aspect of the disclosure includes the first overvoltage detection circuit that determines the overvoltage state of the output voltage using the AND value of the output of the first determination element configured to determine that the feedback voltage detected by the first detection element is below the first reference voltage, and the output of the second determination element configured to determine that the overvoltage detection voltage detected by the second detection element exceeds the second reference voltage. Accordingly, in a case where an abnormality occurs in the first detection element and the feedback voltage is abnormally decreased, the first overvoltage detection circuit can detect an abnormal increase of the output voltage (overvoltage state) caused by the feedback control performed such that the feedback voltage approaches the target value. Meanwhile, in a case where an abnormality occurs in the second detection element and the overvoltage detection voltage is abnormally decreased or abnormally increased, since there is no change in the feedback voltage, unnecessary fault detection is not performed. As a result, it is possible to suitably detect the overvoltage state of the output voltage without increasing a failure rate.

The power supply control device according to the aspect of the present disclosure may further include a second overvoltage detection circuit including a third determination element. The second overvoltage detection circuit may be configured to detect the overvoltage state of the output voltage based on an output of the third determination element. The third determination element may be configured to determine that the feedback voltage exceeds a third reference voltage. According to the aspect of the present disclosure, in a case where the first detection element is normal, it is possible to suitably detect the overvoltage state of the output voltage using the feedback voltage.

In the power supply control device according to the aspect of the present disclosure, the first detection element may include a first resistor and a second resistor that divide the output voltage to generate the feedback voltage, and the second detection element may include a third resistor and a fourth resistor connected in parallel to the first resistor and the second resistor. The third resistor and the fourth resistor may be configured to divide the output voltage to generate the overvoltage detection voltage.

The power supply control device according to the aspect of the present disclosure may further include a controller configured to shut off a power supply output to the load in a case where determination is made that the output voltage is in the overvoltage state. According to the aspect of the present disclosure, it is possible to suitably protect the load from overvoltage.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 2 is an explanatory table showing relationships between states of voltage dividing resistors R1 to R4 and a state of power supply output.

DETAILED DESCRIPTION

Figure 1:
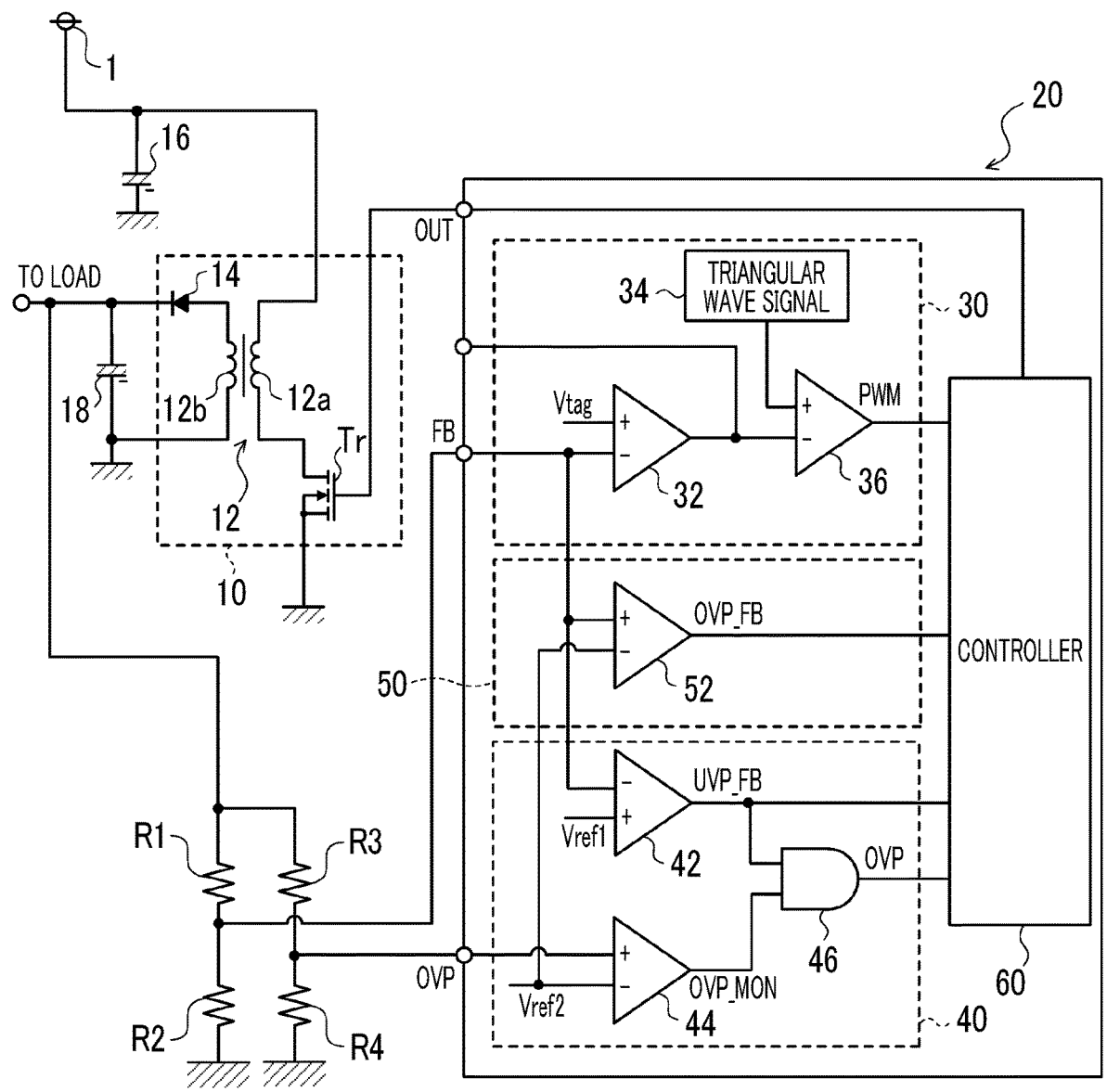
FIG. 1 is a schematic diagram showing a configuration of a power supply control device 20 as an example of the present disclosure.

An embodiment for carrying out the present disclosure will now be described with reference to an example.

FIG. 1 is a schematic diagram showing a configuration of a power supply control device 20 as an example of the present disclosure. The power supply control device 20 in the example is a power supply IC that controls a voltage conversion circuit 10 that converts a voltage from a DC power supply 1 and supplies the voltage to the load, which may be, for example, suitably used for supplying voltage to an inverter that drives a motor as a load, or for supplying voltage to an excitation circuit of a resolver that detects the rotational position of the motor.

The voltage conversion circuit 10 includes a transformer 12 including a primary side coil 12a and a secondary side coil 12b, a transistor Tr (for example, a Metal Oxide Semiconductor Field Effect Transistor (MOSFET)) as a switching element connected to the primary side coil 12a in series with respect to the DC power supply 1, and a diode 14 connected to the secondary side coil 12b in the forward direction with respect to an output terminal. A smoothing capacitor 16 is connected to the output terminal of the DC power supply 1, and a smoothing capacitor 18 is connected to the output terminal of the voltage conversion circuit 10.

To the output terminal of the voltage conversion circuit 10, voltage dividing resistors R1, R2 that divide an output voltage Vout to generate a feedback voltage Vfc are connected, and voltage dividing resistors R3, R4 that divide the output voltage Vout to generate an overvoltage detection voltage Vovp are connected in parallel to the voltage dividing resistors R1, R2.

The power supply control device 20 includes a pulse width modulation signal generation circuit 30 that generates a pulse width modulation signal (PWM signal), first and second overvoltage detection circuits 40, 50 that detect the overvoltage of the voltage conversion circuit 10, and a controller 60 that performs switching control of the voltage conversion circuit 10.

The pulse width modulation signal generation circuit 30 includes a differential amplifier 32 that amplifies a differential voltage (Vfc-Vtag) between the feedback voltage Vfb and a target voltage Vtag, a triangular wave oscillator 34 that generates a triangular wave as a carrier, and a comparator 36 that compares the differential voltage (Vfc-Vtag) and the triangular wave to generate the pulse width modulation signal PWM and outputs the generated PWM signal to the controller 60.

The first overvoltage detection circuit 40 includes a first comparator 42, a second comparator 44, and an AND circuit 46. The first comparator 42 has a non-inverting input terminal for inputting a first reference voltage Vref1 set to a voltage lower than the target voltage Vtag, an inverting input terminal for inputting the feedback voltage Vfc, and an output terminal connected to a first input terminal among two input terminals of the AND circuit 46 and the controller 60. The first comparator 42 outputs an output signal UVP_FB of a low level (L) in a case where the feedback voltage Vfc is equal to or greater than the first reference voltage Vref1, and outputs an output signal UVP_FB of a high level (H) in a case where the feedback voltage Vfc is smaller than the first reference voltage Vref1. The second comparator 44 has a non-inverting input terminal for inputting the overvoltage detection voltage Vovp, an inverting input terminal for inputting a second reference voltage Vref2 set to a voltage higher than the target voltage Vtag, and an output terminal connected to a second input terminal of the AND circuit 46. The second comparator 44 outputs an output signal OVP_MON of low level (L) in a case where the overvoltage detection voltage Vovp is lower than or equal to the second reference voltage Vref2, and outputs an output signal OVP_MON of a high level (H) in a case where the overvoltage detection voltage Vovp is greater than the second reference voltage Vref2. The AND circuit 46 has two input terminals connected to the output terminal of the first comparator 42 and the output terminal of the second comparator 44, and an output terminal connected to the controller 60. The AND circuit 46 outputs an output signal OVP of a high level (H) in a case where the signals UVP_FB, OVP_MON input to the two input terminals are both of the high level (H), and outputs an output signal OVP of a low level (L) in other cases.

The second overvoltage detection circuit 50 includes a third comparator 52. The third comparator 52 has a non-inverting input terminal for inputting the feedback voltage Vfc, an inverting input terminal for inputting the second reference voltage Vref2, and an output terminal connected to the controller 60. The third comparator 52 outputs an output signal OVP_FB of a low level (L) in a case where the feedback voltage Vfc is equal to or less than the second reference voltage Vref2, and outputs an output signal OVP_FB of a high level (H) in a case where the feedback voltage Vfc is greater than the second reference voltage Vref2.

The controller 60 receives the pulse width modulation signal PWM from the pulse width modulation signal generation circuit 30 and performs switching control of the transistor Tr with the input pulse width modulation signal PWM. Accordingly, the output voltage Vout from the voltage conversion circuit 10 is controlled such that the feedback voltage Vfc approaches the target voltage Vtag. The controller 60 also receives the output signals UVP_FB, OVP_MON from the first overvoltage detection circuit 40 and the output signal OVP_FB from the second overvoltage detection circuit 50, and in a case where any one of the input output signals OVP_MON, OVP_FB is determined to be a high level (H) signal, the controller 60 determines that an overvoltage has occurred in the voltage conversion circuit 10 and stops the switching control of the transistor Tr to shut down the voltage conversion circuit 10.

Next, operations of the power supply control device 20 configured as such, in particular, operations of the first overvoltage detection circuit 40 in a case where a fault (open-circuit fault, short-circuit fault) has occurred in the voltage dividing resistors R1 to R4 will be described. FIG. 2 is an explanatory table showing relationships between states of voltage dividing resistors R1 to R4 and a state of power supply output. In a case where neither open-circuit fault nor short-circuit fault has occurred in any of the voltage dividing resistors R1 to R4 (abnormality mode 0 in the table) and overvoltage is not generated in the voltage conversion circuit 10, the output signals UVP_FB, OVP_MON, OVP_FB, OVP of the first to third comparators 42, 44, 52 and the AND circuit 46 are all at low level (L). Thus, the voltage conversion circuit 10 supplies power to the load under the feedback control performed to maintain the feedback voltage Vfc near the target voltage Vtag. In a case where an overvoltage occurs in the voltage conversion circuit 10, the feedback voltage Vfc exceeds the second reference voltage Vref2, and the output signal OVP_FB of the third comparator 52 is set to high level (H). As a result, the voltage conversion circuit 10 is shut down, and the power supply output to the load is thus stopped.

In the case where the open-circuit fault has occurred in the voltage dividing resistor R1 (abnormality mode 1 in the table) or in the case where the short-circuit fault has occurred in the voltage dividing resistor R2 (abnormality mode 4 in the table), the feedback voltage Vfc greatly decreases and falls below the first reference voltage Vref1, and the output signal UVP_FB of the first comparator 42 is set to high level (H). On the other hand, since the controller 60 is under the feedback control by which the feedback voltage Vfc approaches the target voltage Vtag, in a case where the feedback voltage Vfc greatly decreases, the output voltage Vout greatly increases. As a result, the overvoltage detection voltage Vovp exceeds the second reference voltage Vref2, and the output signal OVP_MON of the second comparator 44 is set to high level (H). The output signal OVP of the AND circuit 46 is set to high level (H) as a result. Thus, the voltage conversion circuit 10 is shut down and the power supply output to the load is stopped.

In the case where the short-circuit fault has occurred in the voltage dividing resistor R1 (abnormality mode 2 in the table) or in the case where the open-circuit fault has occurred in the voltage dividing resistor R2 (abnormality mode 3 in the table), the feedback voltage Vfc greatly increases and exceeds the second reference voltage Vref2, and the output signal OVP_FB of the third comparator 52 is set to high level (H). As a result, the voltage conversion circuit 10 is shut down, and the power supply output to the load is stopped.

In the case where the open-circuit fault has occurred in the voltage dividing resistor R3 (abnormality mode 5 in the table) or in the case where the short-circuit fault has occurred in the voltage dividing resistor R4 (abnormality mode 8 in the table), the overvoltage detection voltage Vovp greatly decreases and falls below the second reference voltage Vref2, and the output signal OVP_MON of the second comparator 44 is set to low level (L). The output signal OVP of the AND circuit 46 is set to low level (L) as a result. Thus, the voltage conversion circuit 10 is enabled to supply power to the load under the feedback control regardless of the open-circuit fault in the voltage dividing resistor R3 or the short-circuit fault in the voltage dividing resistor R4.

In a case where the short-circuit fault has occurred in the voltage dividing resistor R3 (abnormality mode 6 in the table) or in a case where the open-circuit fault has occurred in the voltage dividing resistor R4 (abnormality mode 7 in the table), the overvoltage detection voltage Vovp greatly increases above the second reference voltage Vref2, and the output signal OVP_MON of the second comparator 44 is set to high level (H). On the other hand, the feedback voltage Vfc approaches the target voltage Vtag under the feedback control, and the output signal UVP_FB of the first comparator 42 remains at the low level (L). The output signal OVP of the AND circuit 46 is set to low level (L) as a result. Thus, the voltage conversion circuit 10 is enabled to supply power to the load by the feedback control regardless of the short-circuit fault in the voltage dividing resistor R3 or the open-circuit fault in the voltage dividing resistor R4.

The power supply control device 20 of this example described above includes the first overvoltage detection circuit 40 that determines whether or not the output voltage Vout of the voltage conversion circuit 10 is in the overvoltage state. The first overvoltage detection circuit 40 includes the first comparator 42 that outputs a high level signal in a case where the feedback voltage Vfc divided by the voltage dividing resistors R1, R2 connected to the output terminal of the voltage conversion circuit 10 is below the first reference voltage Vref1, the second comparator 44 that outputs a high level signal in a case where the overvoltage detection voltage Vovp divided by the voltage dividing resistors R3, R4 connected in parallel to the voltage dividing resistors R1, R2 connected to the output terminal of the voltage conversion circuit 10 exceeds the second reference voltage Vref2, and the AND circuit 46 that calculates the AND value of the output signals of the first and second comparators 42, 44. As a result, in a case where abnormality occurs in the voltage dividing resistors R1, R2 and the feedback voltage Vfc is abnormally decreased, an abnormal increase of the output voltage Vout (overvoltage state) caused by the feedback control by which the feedback voltage Vfc approaches the target voltage Vtag can be detected by the first overvoltage detection circuit 40. On the other hand, in a case where abnormality occurs in the voltage dividing resistors R3, R4, and the overvoltage detection voltage Vovp abnormally decreases or abnormally increases, since there is no change in the feedback voltage Vfc, unnecessary fault detection is not performed. As a result, it is possible to suitably detect the overvoltage state of the output voltage Vout without increasing a failure rate.

Further, the power supply control device 20 in this example also includes the second overvoltage detection circuit 50. The second overvoltage detection circuit 50 has the third comparator 52 that outputs a high level signal in a case where the feedback voltage Vfc exceeds the second reference voltage Vref2. As a result, in a case where the voltage dividing resistors R1, R2 are operating normally, the overvoltage of the voltage conversion circuit 10 can be suitably detected by the feedback voltage Vfc.

Further, in a case where a high level signal is output from the first overvoltage detection circuit 40 or the second overvoltage detection circuit 50, the power supply control device 20 in this example shuts down the voltage conversion circuit 10, and thus the voltage conversion circuit 10 and the load can be suitably protected from the overvoltage.

In the example, the overvoltage detection circuit includes the first overvoltage detection circuit 40 and the second overvoltage detection circuit 50, but the second overvoltage detection circuit 50 may be omitted.

In the example, the voltage conversion circuit 10 is constituted by a circuit using a transformer. However, the voltage conversion circuit 10 is not limited thereto, and may be constituted by a chopper circuit.

In the example, the voltage dividing resistors R1, R2 correspond to the "first detection element", the voltage dividing resistors R3, R4 correspond to the "second detection element", the first comparator 42 corresponds to the "first determination element", the second comparator 44 corresponds to the "second determination element", and the first overvoltage detection circuit 40 corresponds to the "first overvoltage detection circuit". Also, the third comparator 52 corresponds to the "third determination element", and the second overvoltage detection circuit 50 corresponds to the "second overvoltage detection circuit".

Since the example is provided to specifically describe the embodiment for carrying out the present disclosure described in SUMMARY, the correspondence relationship between the main elements of the example and the main elements of the disclosure described in SUMMARY does not limit the elements of the disclosure described in SUMMARY. That is, the interpretation of the disclosure described in SUMMARY should be made based on the description of SUMMARY, and the example provided above is merely a specific example of the disclosure described in SUMMARY.

Although the embodiment for carrying out the present disclosure has been described above by way of an example, the present disclosure is not limited to the example at all, and it is obvious that the present disclosure can be implemented in various forms insofar as not departing from the gist of the present disclosure.

The present disclosure can be used in the manufacturing industry of the power supply control device.

What is claimed is:

1. A power supply control device that detects an output voltage to a load as a feedback voltage using a first detection element and performs feedback control such that the feedback voltage detected by the first detection element approaches a target value, the power supply control device comprising
    a first overvoltage detection circuit including a first determination element and a second determination element,
    the first overvoltage detection circuit being configured to detect an overvoltage state of the output voltage using an AND value of an output of the first determination element and an output of the second determination element,
    the first determination element being configured to determine that the feedback voltage detected by the first detection element is below a first fixed reference voltage, and
    the second determination element being configured to determine that an overvoltage detection voltage detected by a second detection element exceeds a second reference voltage, the second detection element being connected in parallel to the first detection element and being configured to detect the output voltage as the overvoltage detection voltage, wherein the AND value is a high level when the first determination element determines that the feedback voltage is below the first fixed reference voltage and the second determination element determines that the overvoltage detection voltage exceeds the second reference voltage.

2. The power supply control device according to claim 1, further comprising a second overvoltage detection circuit including a third determination element, wherein:
    the second overvoltage detection circuit is configured to detect the overvoltage state of the output voltage based on an output of the third determination element; and
    the third determination element is configured to determine that the feedback voltage exceeds a third reference voltage.

3. The power supply control device according to claim 1, wherein:
    the first detection element includes a first resistor and a second resistor that divide the output voltage to generate the feedback voltage;
    the second detection element includes a third resistor and a fourth resistor connected in parallel to the first resistor and the second resistor; and
    the third resistor and the fourth resistor are configured to divide the output voltage to generate the overvoltage detection voltage.

4. The power supply control device according to claim 1, further comprising a controller configured to shut off a power supply output to the load in a case where determination is made that the output voltage is in the overvoltage state.

* * * * *

UNITED STATES PATENT AND TRADEMARK OFFICE
CERTIFICATE OF CORRECTION

PATENT NO. : 10,784,671 B2
APPLICATION NO. : 16/255325
DATED : September 22, 2020
INVENTOR(S) : Eiichirou Shigehara, Takeshi Hirano and Akira Tokumasu It is certified that error appears in the above-identified patent and that said Letters Patent is hereby corrected as shown below:

On the Title Page

In item (71), applicant, city, delete "Kariya-shi, Aichi-ken" and insert --Kariya-city, Aichi-pref.--, therefor.

In item (72), inventor 1, city, delete "Nagoya" and insert --Nagoya-shi Aichi-ken--, therefor.

In item (72), inventor 2, city, delete "Okazaki" and insert --Okazaki-shi Aichi-ken--, therefor.

In item (72), inventor 3, city, delete "Kariya" and insert --Kariya-shi Aichi-ken--, therefor.

In item (73), assignee, city, delete "Kariya, Aichi-pref" and insert --Kariya-city, Aichi-pref.--, therefor.

Signed and Sealed this
Fifth Day of January, 2021

Andrei Iancu
*Director of the United States Patent and Trademark Office*